United States Patent [19]
Kuijk et al.

[11] Patent Number: 5,652,439
[45] Date of Patent: Jul. 29, 1997

[54] FAST ELECTRICAL COMPLETE TURN-OFF OPTICAL DEVICE

[75] Inventors: Maarten Kuijk, Antwerp; Paul Heremans, Louvain; Roger Vounckx, Schaarbeek; Gustaaf Borghs, Kessel-Lo, all of Belgium

[73] Assignee: IMEC, Louvain, Belgium

[21] Appl. No.: 481,514

[22] PCT Filed: Dec. 3, 1993

[86] PCT No.: PCT/BE93/00074

§ 371 Date: Sep. 8, 1995

§ 102(e) Date: Sep. 8, 1995

[87] PCT Pub. No.: WO95/15583

PCT Pub. Date: Jun. 8, 1995

[51] Int. Cl.$^6$ .............. H01L 29/74; H01L 31/111
[52] U.S. Cl. .................... 257/113; 257/115; 257/463; 257/464
[58] Field of Search .................. 257/113, 114, 257/115, 116, 117, 118, 463, 464

[56] References Cited

U.S. PATENT DOCUMENTS

| 4,166,224 | 8/1979 | Hutson | 257/113 X |
| 4,244,000 | 1/1981 | Ueda et al. | 257/113 X |
| 4,999,688 | 3/1991 | Hara et al. | 257/113 X |
| 5,136,353 | 8/1992 | Pankove et al. | 257/113 X |
| 5,148,253 | 9/1992 | Kimura | 257/115 |

FOREIGN PATENT DOCUMENTS 5574168 6/1980 Japan ..................... 257/113

OTHER PUBLICATIONS

Applied Physics Letters, vol. 61, No. 11, Sep. 1992, pp. 1326–1328.
Applied Physics Letters, vol. 57, No. 11, Sep. 1990, pp. 1075–1077.
Microelectronic Engineering, vol. 19, No. 9, Sep. 1992, pp. 49–52.
International Electron Devices Meeting, Dec. 1991, pp. 433–436.
IEEE Transactions on Electron Devices, vol. 39, No. 8, Aug. 1992, pp. 1858–1864.
Electronics Letters, vol. 26, No. 5, Mar. 1990, pp. 280–282.

Primary Examiner—William Mintel
Attorney, Agent, or Firm—McDonnell Boehnen Hulbert & Berghoff

[57] ABSTRACT

The invention relates generally to optoelectronic pnpn devices and more particularly to a layer structure suitable for fast electrical complete turn-off of such devices and to a method for efficient and fast operation of such devices and differential pairs of such devices. The devices have four layers and three junctions, and the invention provides for complete depletion of both center layers. The differential pair of pnpn devices also provides a very sensitive optical receiver which combines a very high cycle frequency with a very high optical sensitivity.

17 Claims, 2 Drawing Sheets

FAST ELECTRICAL COMPLETE TURN-OFF OPTICAL DEVICE

FIELD OF THE INVENTION

The invention relates generally to optoelectronic pnpn devices and more particularly to a layer structure suitable for fast electrical complete turn-off of such devices and to a method for efficient and fast operation of such devices and differential pairs of such devices.

BACKGROUND

Optical devices concerned with this invention are those including three junctions, e.g. optical thyristors and Shockley diodes. Such devices are promising candidates for use in fast and sensitive optical receivers and combined optical transmitter-receivers for digital signals in fiber and free-space optical interconnections.

For use in industrial applications, however, the existing trade-off between cycle frequency and optical sensitivity is a major problem. The cycle frequency corresponds with the bitrate for reception (and eventual digital optical retransmission). A measure for the optical sensitivity is the required energy of optical input pulses to obtain reliable detection.

A high optical sensitivity can be reached by biasing the pnpn-device critically close to the breakover voltage. To reach this point, the bias has to be applied slowly (at least in microseconds) in order to avoid dV/dt triggering. Furthermore, the turn-on delay after application of a light pulse is also too long, namely micro- or milliseconds.

JP-A-3-235926 teaches that a high optical sensitivity can be obtained without critical biasing by using a differential pair of pnpn-devices instead of a single one. However, the trade-off between optical sensitivity and cycle speed remains a concern. Before an input light pulse is applied, the number of free carriers in both pnpn devices of the pair have to be equal. High sensitivity for input light requires a long waiting time before the optical light is applied to ensure the balance. It has been shown experimentally that a higher cycle speed results in a lower sensitivity.

High cycle speed has been obtained (without high optical sensitivity) by extracting carriers using a third and a fourth contact on the center layers of a pnpn device (Y. Tashiro, K. Kasahara, N. Hamao, M. Sugimoto, R. Yanase, "High speed response in optoelectronic gated thyristor", Japanese J. Appl. Phys., vol 26, 1014 (1987) and also G. W. Taylor, R. S. Mand, J. G. Simmons, and A. Y. Cho, "Ledistor, a three terminal double heterostructure optoelectronic switch.", Appl. Phys. Lett. vol 50, 338 (1987). However, not all majority carriers can be extracted since the extracting layer itself gets punched through.

Fast extraction of free carriers in the center n-layer has already been obtained in a double heterojunction optical thyristor by applying a negative voltage to the anode (P. Heremans, M. Kuijk, D. A. Suda, R. Vounckx, R. E. Hayes and G. Borghs, "Fast Turn-Off of Two-Terminal Double Heterojunction Thyristor Device" Appl. Phys. Lett. 61, 1326 (1992). A turn-off time of 10 ns and an optical sensitivity of up to 100 pJ have been reported. This optical input energy is large due to the fact that an uncontrollable residue of free holes remains in the center p-layer of the structure. This uncertainty in the remaining free holes results in higher light input being required to switch the device.

SUMMARY OF THE INVENTION

It is the object of the invention to provide an optical device in which both center layers can be completely depleted, thereby resulting in the aforementioned trade-off being avoided.

This objective is attained in accordance with the invention with an optoelectronic device including at least a first, a second, a third and a fourth layer, said first and third layers being of one conductivity type while said second and fourth layers are of the opposite conductivity type, the said second and third layers complying with the following relation:

$$\int_0^W (N(x))^{0.875} dx < \left(\frac{E_g}{1.41\,eV}\right)^{0.75} 3.6 \times 10^{10}\,cm^{-1.625}$$

and either one of said second and third layers complying with the following relation:

$$\int_0^W \sqrt{N(x)}\, dx > 2 \times 10^3\, cm^{-0.5}$$

where:

W is the physical width of the layer (in cm),

N(x) is the doping concentration (in $cm^{-3}$) as a function of position, $E_g$ is the mean value of the bandgap energy (in eV) in the said layer.

By applying a negative voltage pulse to the anode with respect to the cathode, complete carrier removal from the second and third layers can be achieved, thus resulting in a fast complete turn-off state being achieved in a few picoseconds. When this complete turn-off state is reached, the optoelectronic device is capable of detecting minimum amounts of input light.

Operating a differential pair of optical pnpn devices according to this invention provides a very sensitive optical receiver which combines a very high cycle frequency (in the order of gigahertz) with a very high optical sensitivity (in the order of femtojoules).

DETAILED DESCRIPTION

When light input illuminates a pnpn device, free carriers are generated, which are stored mainly in the center n and p layers. In order that minimum amounts of input light can be detected, it is required to start from a situation with a perfectly controlled number of free carriers residing in the center layers of the pnpn device prior to impingement of light input. This state will be called "the complete turn-off state".

Experiments by the inventors have shown that complete removal of the free carriers in the center n and p layers is achieved by applying a negative voltage pulse $V_A$ to the anode for selected combinations of doping concentrations and layer thicknesses of the center layers of the structure.

Figure 1:
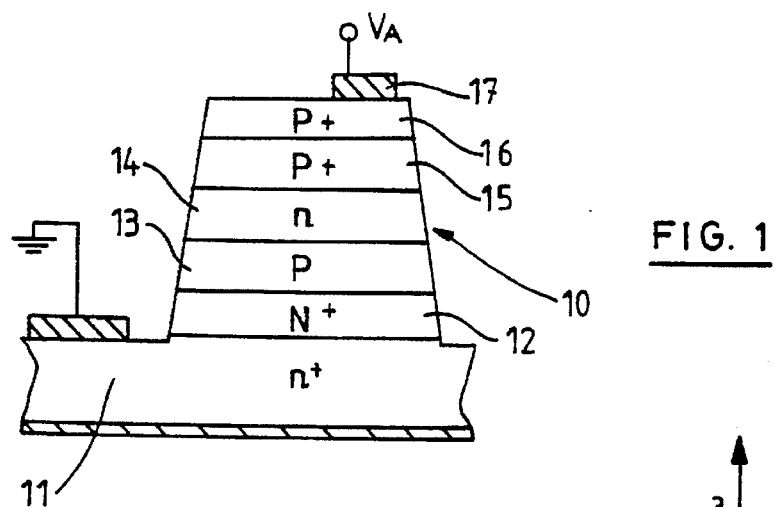
FIG. 1 is a cross-section of an optoelectronic device having a layer structure according to the invention.

Referring to FIG. 1 there is shown a cross-sectional view of an exemplary device in accordance with this invention. The layer structure includes following layers: a 1500-nm, $n^+$-GaAs buffer layer 11; a 1000 nm, $1\times10^{18}$ cm$^{-3}$, n-Al$_{0.05}$Ga$_{0.95}$As layer 12; a 170 nm, $2\times10^{17}$ cm$^{-3}$, p-GaAs layer 13; a 170 nm, $2\times10^{17}$ cm$^{-3}$, n-GaAs layer 14; a 280 nm, $1\times10^{19}$ cm$^{-3}$, p-Al$_{0.2}$Ga$_{0.8}$As layer 15, and finally a 20 nm, $2\times10^{19}$ cm$^{-3}$, p-GaAs contact layer 16. Mesas of 28×42 μm$^2$ and 900 nm high were obtained by wet etching. The top (anode) contact was a 25×12 μm$^2$ pad 17 of Au/AuZn (alloyed at 380° C.) obtained by lift-off, leaving an optical window of 28×28 μm$^2$.

In accordance with this invention the second and third layers (or groups of p and n layers) should comply with the following relation:

$$\int_0^W (N(x))^{0.875} dx < \left(\frac{E_g}{1.41\,eV}\right)^{0.75} 3.6 \times 10^{10}\,cm^{-1.625} \quad (1)$$

and either one of the second and third layers should comply with the following relation:

$$\int_0^W \sqrt{N(x)}\, dx > 2 \times 10^3\,cm^{-0.5} \quad (2)$$

where

W is the physical width of the layer (in cm),

N(x) is the doping concentration (in cm$^{-3}$) as a function of position (in cm), and $E_g$ is the mean value of the bandgap energy (in eV) in the said layer.

Figure 2:
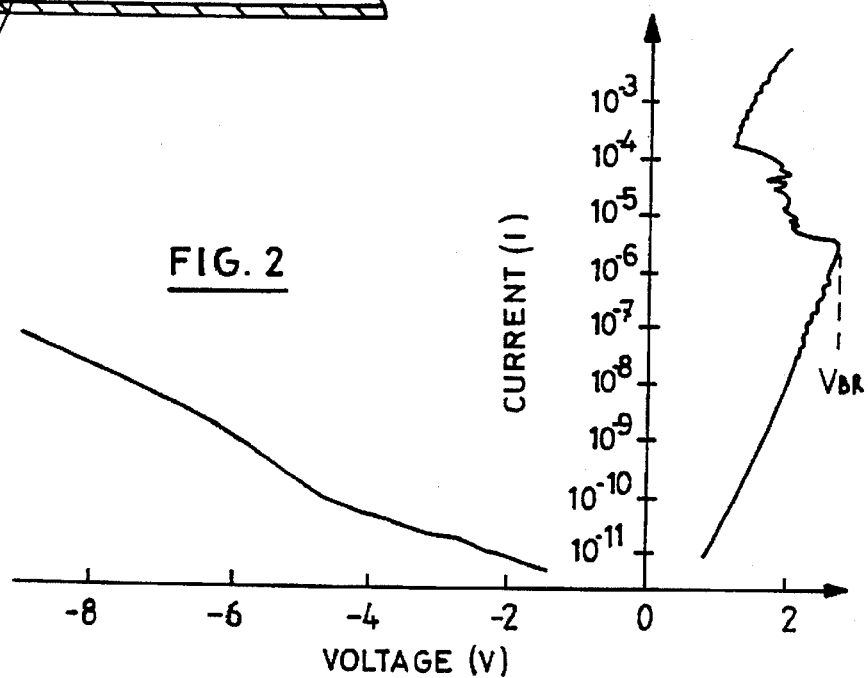
FIG. 2 is a typical current-voltage characteristic curve of the device of FIG. 1.

FIG. 2 shows the current-voltage characteristics of this device for both positive and negative anode voltages. The static breakover voltage $V_{BR}$ is 2.69 V, and the forward current-voltage characterisctics show a negative differential regime. The reverse current-voltage characteristics show no breakdown for a voltage above −9 Volts.

With too low doping and/or too thin center layers, breakover voltages below 2 V (no negative differential regime left) are obtained while too high doping and/or too thick center layers result in an incomplete carrier removal because avalanche breakdown occurs in one or both of the outer junctions before completion of carrier extraction.

Figure 3:
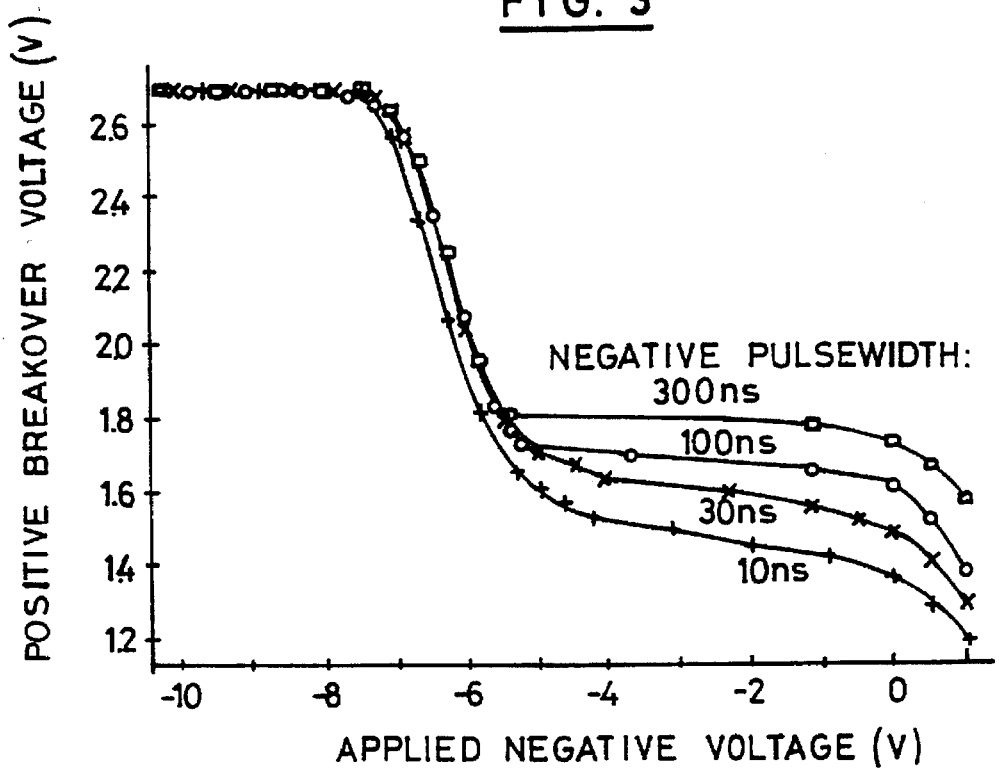
FIG. 3 is a diagram of the forward positive switching voltage of the pnpn-device versus applied negative pulse voltage for different negative pulse durations.
Figure 4:
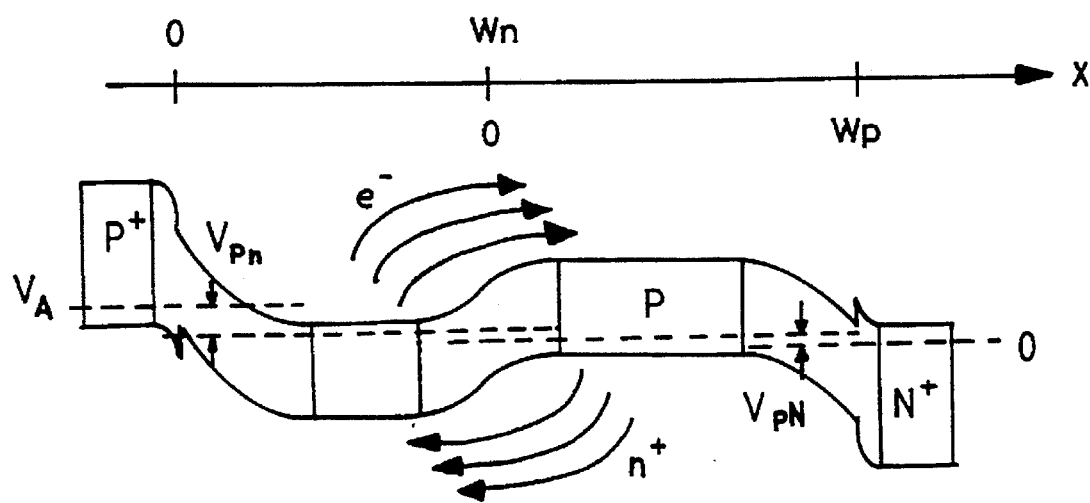
FIG. 4 illustrates the carrier extraction mechanism in a pnpn layer structure of the invention.

FIG. 3 shows the forward positive voltage at which the device switches ON versus the negative voltage of the applied pulse for four pulse durations. This diagram evidences that the complete turn-off state can be reached in the pnpn-device according to the invention. The fact that below −7.5 V the forward switching voltage is independent from the negative pulse duration and the negative voltage itself proves that complete extraction of the free carriers in the center n and p layers has been reached. The speed with which the complete turn-off state can be reached is intrinsically limited by drift and diffusion of the carriers being extracted. These drift and diffusion mechanisms are illustrated in FIG. 4.

Figure 5:
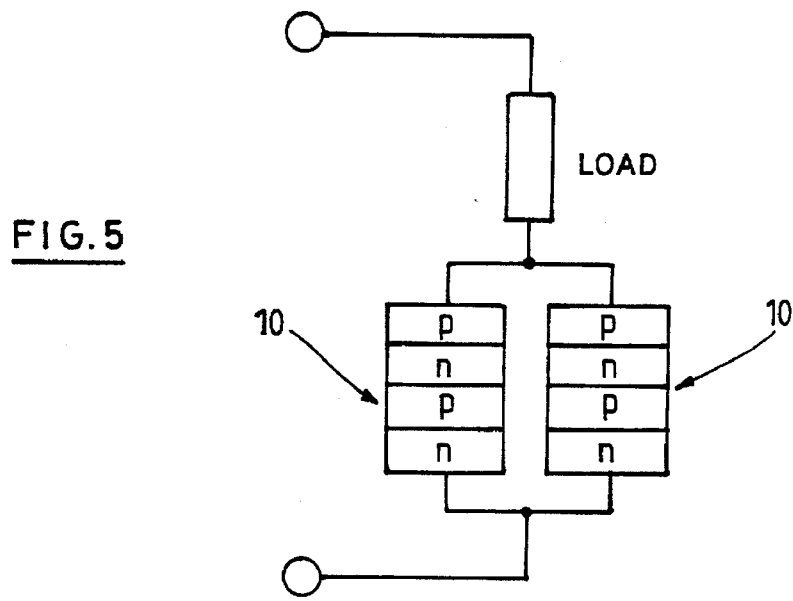
FIG. 5 shows the parallel arrangement of two pnpn-devices forming together a differential pair with a common load connected in series.

The complete turn-off layer structure of the invention can be used with advantage in a monolithic differential pair arrangement. FIG. 5 shows two pnpn-devices 10 with a common load connected in series. Such an arrangement including devices according to this invention provides a very sensitive optical receiver that can be operated at a high cycle speed.

In use, when applying a negative anode-to-cathode pulse, both devices of the pair are reset to their complete turn-off state in picoseconds. By contrast, a differential pair of state-of-the-art pnpn-devices requires a long waiting period before the devices can be illuminated to ensure that the number of free carriers be equal in the center layers of both devices.

As soon as complete turn-off state is reached, light input is directed to the devices and a positive voltage is then applied to the pair. The pnpn device having the highest precharge from input light switches ON while the other device remains OFF. The usual time-consuming waiting phase is thereby avoided and a very short complete turn-off phase occurs instead, thus resulting in a high cycle speed together with a very sensitive operation.

Preliminary experiments on devices described in this invention resulted in an extremely short extraction pulse, namely a 3 ns pulse. The use of these devices in a differential pair resulted in a very high optical sensitivity, namely below 50 femtojoules.

We claim:

1. An optoelectronic device comprising at least a first, a second, a third and a fourth layer, said first and third layers being of one conductivity type while said second and fourth layers are of an opposite conductivity type, characterized in that said second and third layers comply with a following predetermined relation:

$$\int_0^W (N(x))^{0.875} dx < \left(\frac{E_g}{1.41\,eV}\right)^{0.75} \cdot 3.6 \cdot 10^{10}\,cm^{-1.625}$$

and one of said second and third layers complies with a following relation:

$$\int_0^W \sqrt{N(x)}\, dx > 2 \cdot 10^3\,cm^{-0.5}$$

where:

W is a physical width of a layer (in cm),

N(x) is a doping concentration (in cm$^{-3}$) as a function of position (in cm), $E_g$ is a mean value of a bandgap energy (in eV) in a layer.

2. An optoelectronic device comprising two devices according to claim 1, connected in a differential pair arrangment.

3. An optoelectronic device according to claim 1, characterized in that, prior to coupling a light input signal, a negative anode-to-cathode voltage pulse is applied to the device in such a way that all free carriers in said second and third layers get extracted, leaving the device in a complete turn-off state.

4. An optoelectronic device according to claim 2, characterized in that, prior to applying a light input signal to the differential pair arrangement, a negative anode-to-cathode voltage pulse is applied to said differential pair of devices in order to reset said two devices.

5. An optoelectronic device according to claim 2, characterized by applying a negative anode-to-cathode voltage to reset said two devices, directing light input signal to the devices and applying a positive voltage to the pair such that one of said devices of the differential pair switches on.

6. An optoelectronic device comprising:

a first layer of a first semiconductor material that is of a first conductivity type;

a second layer of a second semiconductor material that is of a second conductivity type which is opposite of said first conductivity type, said second layer juxtaposed to said first layer and having a second width, a second doping concentration as a first function of distance along said second width, and a second bandgap energy as a second function of distance along said second width;

a third layer of a third semiconductor material that is of said first conductivity type, juxtaposed to said second layer and having a third width, a third doping concentration as a third function of distance along said third width, and a third bandgap energy as a fourth function of distance along said third width;

a fourth layer of a fourth semiconductor material that is of said second conductivity type, juxtaposed to said third layer;

a first biasing terminal operatively connected to said first layer for applying a first voltage to said first layer;

a second biasing terminal operatively connected to said fourth layer for applying a second voltage to said fourth layer; and wherein, a bias voltage difference, between said first and second voltages, having a first magnitude that is greater than a second magnitude of a predetermined voltage difference removes substantially all charge carriers in said second and third layers.

7. The optoelectronic device of claim 6 wherein, said second and third widths, said second and third doping concentrations, and said second and third bandgap energies are adapted to facilitate carrier removal prior to the occurrence of junction breakdown.

8. The optoelectronic device of claim 6 wherein, said first conductivity type is p-type and said second conductivity type is n-type, and wherein, said bias voltage difference and said predetermined voltage difference are negative.

9. A differential pair of optoelectronic devices comprising:

a first differential pair terminal for receiving a first voltage;

a second differential pair terminal for receiving a second voltage;

a first optoelectronic device, operatively connected between said first and second differential pair terminals, for being exposed to a first light having a first intensity; and a second optoelectronic device, operatively connected between said first and second differential pair terminals for parallel connection to said first optoelectronic device, for being exposed to a second light having a second intensity;

each of said first and second optoelectronic devices further comprising:

a first layer of a first semiconductor material that is of a first conductivity type;

a second layer of a second semiconductor material that is of a second conductivity type which is opposite of said first conductivity type, said second layer juxtaposed to said first layer and having a second width, a second doping concentration as a first function of distance along said second width, and a second bandgap energy as a second function of distance along said second width;

a third layer of a third semiconductor material that is of said first conductivity type, juxtaposed to said second layer and having a third width, a third doping concentration as a third function of distance along said third width, and a third bandgap energy as a fourth function of distance along said third width;

a fourth layer of a fourth semiconductor material that is of said second conductivity type, juxtaposed to said third layer;

a first biasing terminal, operatively connected to said first layer and said first differential pair terminal, for applying said first voltage to said first layer;

a second biasing terminal, operatively connected to said fourth layer and said second differential pair terminal, for applying said second voltage to said fourth layer; and wherein, a first bias voltage difference, between said first and second voltages, having a first bias magnitude that is greater than a first predetermined magnitude of a first predetermined voltage difference, removes substantially all charge carriers in said second and third layers.

10. The differential pair of claim 9 wherein, said second and third widths, said second and third doping concentrations, and said second and third bandgap energies are adapted to facilitate carrier removal prior to the occurrence of junction breakdown.

11. The differential pair of claim 9 wherein, said first conductivity type is p-type and said second conductivity type is n-type, and wherein said first bias voltage difference and said first predetermined voltage difference are negative.

12. The differential pair of claim 9 wherein, after said first bias voltage difference between said first and second voltages removes substantially all charge carriers in said second and third layers, a second bias voltage difference, between said first and second voltages, having a second bias magnitude that is greater than a second predetermined magnitude of a second predetermined voltage difference, turns ON said first optoelectronic device and maintains OFF said second optoelectronic device when said first intensity is greater than said second intensity, and turns ON said second optoelectronic device and maintains OFF said first optoelectronic device when said second intensity is greater than said first intensity.

13. The differential pair of claim 12 wherein, said first conductivity type is p-type and said second conductivity type is n-type, and wherein said first predetermined voltage difference is negative and said second predetermined voltage difference is positive.

14. A differential pair of optoelectronic devices comprising:

a first differential pair terminal for receiving a first voltage;

a second differential pair terminal for receiving a second voltage;

a first optoelectronic device, operatively connected between said first and second differential pair terminals, for being exposed to a first light having a first intensity;

a second optoelectronic device, operatively connected between said first and second differential pair terminals for parallel connection to said first optoelectronic device, for being exposed to a second light having a second intensity; and means for biasing said first and second optoelectronic devices in a complete turn-off state with a first bias voltage difference, between said first and second voltages, having a first bias magnitude that is greater than a first predetermined magnitude of a first predetermined voltage difference.

15. The differential pair of claim 14, further comprising:

means for turning ON said first optoelectronic device and maintaining OFF said second optoelectronic device when said first intensity is greater than said second intensity, and turning ON said second optoelectronic device and maintaining OFF said first optoelectronic device when said second intensity is greater than said first intensity, with a second bias voltage difference, between said first and second voltages, having a second bias magnitude that is greater than a second predetermined magnitude of a second predetermined voltage difference.

16. The optoelectronic device of claim 7 wherein said second and third layers comply with a following relation:

$$\int_0^W (N(x))^{0.875} dx < \left(\frac{E_g}{1.41eV}\right)^{0.75} \cdot 3.6 \cdot 10^{10} \, cm^{-1.625}$$

and one of said second and third layers complies with a following relation:

$$\int_0^W \sqrt{N(x)} \, dx > 2 \cdot 10^3 \, cm^{-0.5}$$

where:

W is a physical width of a layer (in cm),

N(x) is a doping concentration (in $cm^{-3}$) as a function of position (in cm), $E_g$ is a mean value of a bandgap energy (in eV) in a layer.

17. The differential pair of claim 10 wherein said second and third layers comply with a following relation:

$$\int_0^W (N(x))^{0.875} dx < \left(\frac{E_g}{1.41eV}\right)^{0.75} \cdot 3.6 \cdot 10^{10} \, cm^{-1.625}$$

and one of said second and third layers complies with a following relation:

$$\int_0^W \sqrt{N(x)} \, dx > 2 \cdot 10^3 \, cm^{-0.5}$$

where:

W is a physical width of a layer (in cm),

N(x) is a doping concentration (in $cm^{-3}$) as a function of position (in cm), $E_g$ is a mean value of a bandgap energy (in eV) in a layer.

* * * * *